United States Patent [19]

Lee et al.

[11] Patent Number: 4,959,325

[45] Date of Patent: Sep. 25, 1990

[54] REDUCTION OF ELECTRIC FIELD EFFECT IN THE BIRD'S BEAK REGION OF A DRAM CELL FOLLOWING EXPANSION OF ACTIVE REGION THROUGH LOCAL ENCROACHMENT REDUCTION

[75] Inventors: Ruojia R. Lee; D. M. Durcan, both of Boise, Id.

[73] Assignee: Micron Technology, Inc., Boise, Id.

[21] Appl. No.: 316,135

[22] Filed: Feb. 24, 1989

[51] Int. Cl.$^5$ .................... H01L 21/425; H01L 29/96
[52] U.S. Cl. ...................................... 437/30; 437/47; 357/23.6
[58] Field of Search ............................ 437/47, 52, 30; 357/23.6, 23.8, 23.11

[56] References Cited

U.S. PATENT DOCUMENTS

| | | | |
|---|---|---|---|
| 4,414,058 | 11/1983 | Mueller | 156/643 |
| 4,637,128 | 1/1987 | Mizutani | 437/70 |
| 4,642,880 | 2/1987 | Mizutani | 357/23.11 |
| 4,830,974 | 5/1989 | Chang et al. | 437/34 |

FOREIGN PATENT DOCUMENTS

| | | | |
|---|---|---|---|
| 57-113280 | 7/1982 | Japan | 357/23.6 |
| 58-186968 | 11/1983 | Japan | 437/70 |
| 62-238661 | 10/1987 | Japan | 357/23.6 |

Primary Examiner—Olik Chaudhuri
Assistant Examiner—O. Ojan
Attorney, Agent, or Firm—Angus C. Fox; Stan Protigal; Jon Busack

[57] ABSTRACT

The present invention constitutes an improvement of the Local Encroachment Reduction (LER) process developed by Tyler Lowrey at Micron Technology, Inc. of Boise, Idaho. LER consists of selectively etching a portion of the field oxide which has encroached into a DRAM cell's active area and then subjecting the cell to a high-energy boron implant to maintain adequate active area isolation. Although the boron implant effectively decreases the width of the depletion region between n+ active areas and p+ substrate, it has the undesirable effect of reducing the breakdown voltage at the n-p junctions in the bird's beak regions at the edges of the active regions, thus increasing the cell's susceptibility to gated-diode breakdown following creation of the cell plate. The present invention solves this problem by creating a graded junction in the bird's beak regions of the cell. The graded junction reduces the electric field intensity in the junction region, resulting in an increase in the breakdown voltage. The graded junction also minimizes the effect of gated-diode breakdown and band-band tunneling leakage.

7 Claims, 7 Drawing Sheets

REDUCTION OF ELECTRIC FIELD EFFECT IN THE BIRD'S BEAK REGION OF A DRAM CELL FOLLOWING EXPANSION OF ACTIVE REGION THROUGH LOCAL ENCROACHMENT REDUCTION

FIELD OF THE INVENTION

This invention relates to the manufacture of semiconductor circuit devices and, more particularly, to techniques for reducing electric-field induced current leakage in the bird's beak region of VLSI memory arrays such as dynamic random access memories (DRAMs).

BACKGROUND OF THE INVENTION

This invention relates to manufacturing processes used to create multilayer semiconductor circuit devices on silicon substrates. Those processes generally subject a silicon wafer to an ordered series of steps, which may include photomasking, material deposition, oxidation, nitridization, ion implantation, diffusion and etching, in order to achieve a final product.

As the area allocable to individual memory cells within a DRAM array has shrunk in the face of ever-increasing memory densities, a variety of techniques have been employed by semiconductor manufacturers to maintain cell capacitance and to minimize capacitor charge leakage. The effort has been driven by a desire to minimize cell refresh overhead and the requirement that cell capacitance be sufficient to ensure proper sensing of data by bit line sense amps--even in the presence of single event upsets such as alpha particle radiation.

One way to increase cell capacitance is to maximize the usable portion of the active regions. During the process of field oxidation, oxide encroaches beneath the silicon nitride layer which is used to protect the cell's active regions. A number of processes have been developed to reduce this encroachment. Each of the processes has its advantages and disadvantages, and most add a great deal of complexity to the manufacturing process.

A key technique for reducing field oxide encroachment into the active regions is that of Local Encroachment Reduction (LER). Developed by Tyler Lowrey of Micron Technology, Inc., the technique consists of selectively etching a predetermined portion of the field oxide present within the array's active regions and then subjecting the active regions (including the etched areas) to a high-energy boron implant in order to maintain adequate active area isolation. The boron implant also doubles as a capacitance-enhancing technique.

The boron implanting technique, or so-called "Hi-C" process, consists of implanting boron ions below the array's active regions. The process has been widely used in DRAM manufacturing to increase cell capacitance and improve refresh characteristics by reducing the width of the depletion region between the n+ active regions and the p substrate and by creating a substrate gradient which functions as an electrical barrier to capacitive-charge-destroying migrating holes. DRAM cells which have received "Hi-C" implanting demonstrate a markedly reduced susceptibility to alpha-particle-generated soft errors.

SUMMARY OF THE INVENTION

The present invention constitutes an improvement to Lowrey's LER process. In a world where ever-increasing component densities mandate ever-smaller device dimensions with no corresponding decrease in supply voltages, it is often the case that an enhancement of one performance characteristic results in the degradation of another. In the boron-implantation step of the LER process, boron ions are implanted not only beneath the cell's active regions, but in the inactive regions beneath the field oxide as well. This increase of impurity concentration is especially detrimental beneath the bird's beak regions, as it reduces the breakdown voltage at the junction between the n+ and p regions. This reduction in breakdown voltage is especially significant in the completed cell, since, with the removal of the peripheral field oxide, the cell plate is sufficiently near the junction so as to render it susceptible to gated-diode breakdown and band-band tunneling leakage when the cell is capacitively charged. The desirability of positioning cell capacitor plates contiguous with or overlapping the cell's bird's beak region in order to utilize every bit of available active area was a major motivating force in the development of the present invention.

The present invention makes the LER process much more tolerant of minor process variables such as mask alignments and the timing and rate of the etching process. The essence of the invention is the creation of a graded junction in the bird's beak regions of the cell. The graded junction reduces the electric-field intensity in the junction region, resulting in an increase in the breakdown voltage. The graded junction also minimizes the effect of gated-diode breakdown and band-band tunneling leakage.

DESCRIPTION OF THE PREFERRED EMBODIMENT

Figure 1:
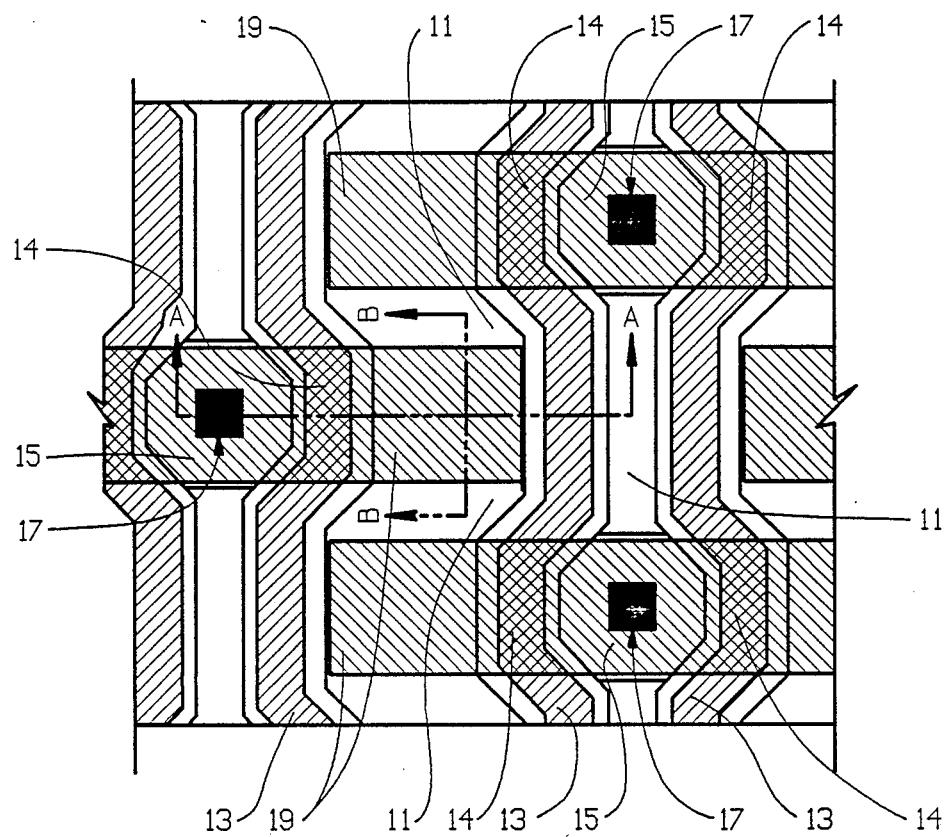
FIG. 1 is a top plan view of a typical DRAM memory cell array during fabrication, subsequent to field oxide growth, field-effect transistor construction, boron channel-stop implant and phosphorus self-aligned lightly-doped-drain implant.

Referring now to FIG. 1, a DRAM cell array is shown during fabrication, subsequent to conventional field oxide growth, construction of a field-effect transistor (FET) having gate sidewall spacers, boron channel-stop implant and phosphorus self-aligned lightly-doped FET drain and source implant. The field oxide regions 11 are shown as the white-colored areas bounded by broken lines; the narrow zig-zagging shaded areas are the word lines 13, which form and interconnect FET gates 14 within a particular array column; the FET source regions 15 are the octagonally-shaped shaded areas between FET pairs having black filled squares 17 (the eventual bit line connection points); the active FET drain and cell capacitor regions 19 are the remaining shaded areas.

Figure 2A:
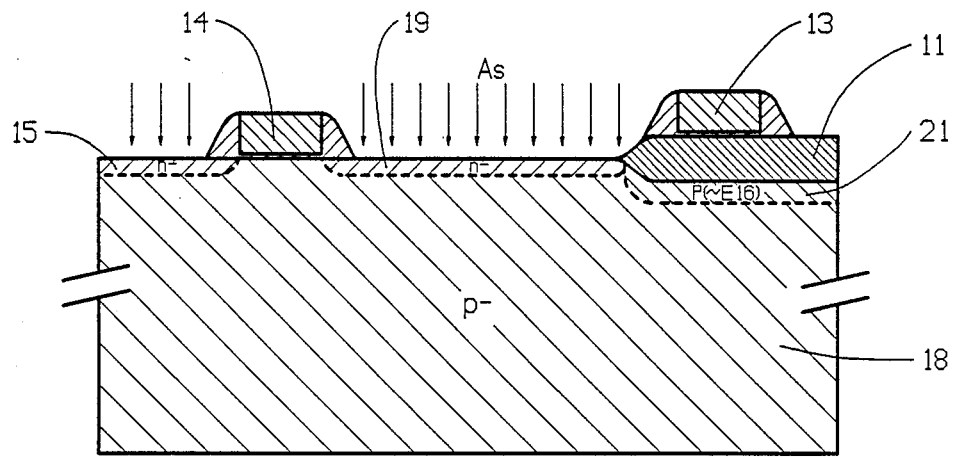
FIG. 2A is a cross-sectional view of a cell on the DRAM array of FIG. 1, taken through broken line A—A of FIG. 1, with the arrows indicating the cell regions which are to be subjected to an arsenic n-channel source/drain implant.

Referring now to the individual cell layout of FIG. 2A, as shown in a cross-sectional view of a cell in FIG. 1 taken directionally along a row of the array through broken line A—A, word line 13 and FET gate 14 are formed from a poly-1 layer, the substrate beneath the field oxide region 11 has received a boron implant to become channel-stop p-type silicon 21, and both FET source region 15 and active region 19 have been lightly doped with a self-aligned phosphorus implant. The boron concentration in the channel-stop region beneath the field oxide region is on the order of $10^{16}$ atoms per cubic centimeter (E16). The arrows indicate the cell regions to be subjected to an arsenic n-channel source/drain implant. The substrate 18 is lightly-doped p-type silicon.

Figure 2B:
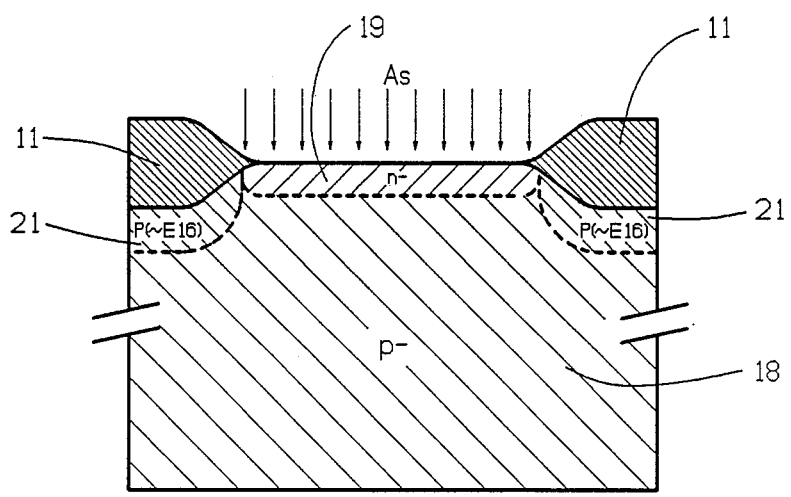
FIG. 2B is a cross-sectional view of a cell on the DRAM array of FIG. 1, taken through broken line B—B of FIG. 1, with the arrows indicating the cell region which is to be subjected to an arsenic n-channel source/drain implant.

The cross-sectional view of the cell in FIG. 2B is taken directionally along a column of the array through broken line B—B of FIG. 1. Channel-stop p-type silicon 21 is shown beneath field oxide regions 11, and active region 19 is shown lying between field oxide regions 11. The arrows indicate the cell region to be subjected to an arsenic n-channel source/drain implant.

Figure 3A:
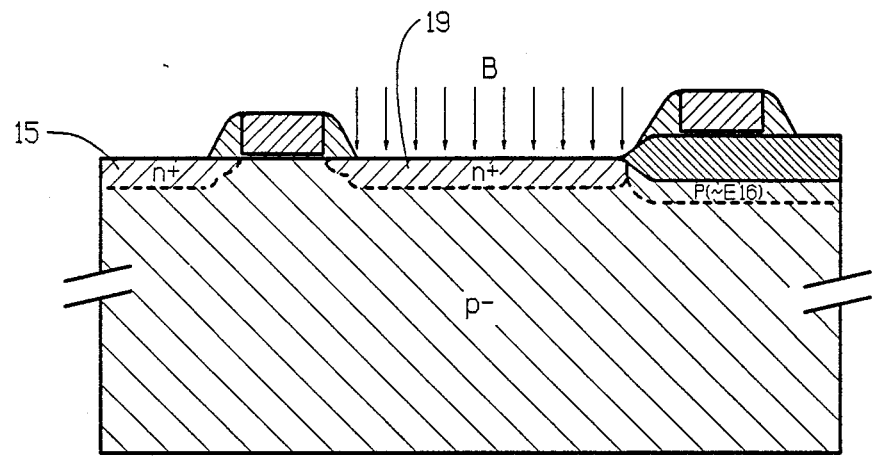
FIG. 3A is the cross-sectional view of the cell of FIG. 2A, following an arsenic n-channel source/drain implant, with the arrows indicating the cell region which is to be subjected to a "Hi-C" implant.
Figure 3B:
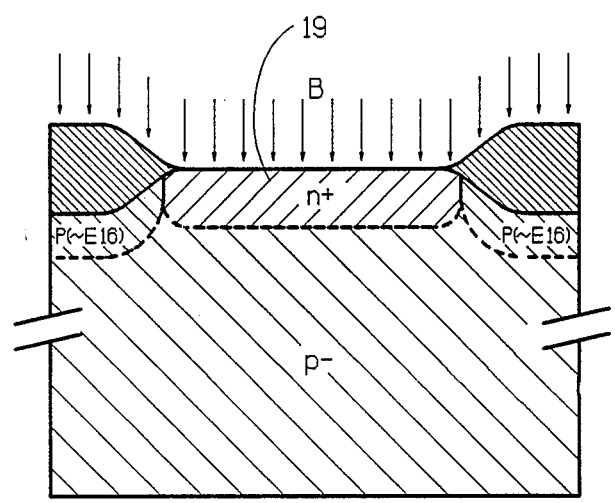
FIG. 3B is the cross-sectional view of the cell of FIG. 2B, following an arsenic n-channel source/drain implant, with arrows indicating the cell region which is to be subjected to a "Hi-C" implant.

Referring now to FIGS. 3A and 3B, the cell of FIGS. 2A and 2B has been subjected to an arsenic n-channel source and drain implant, converting both the FET source region 15 and the active region 19 into n+ regions. The arrows indicate the cell region to be subjected to a "Hi-C" boron implant.

Figure 4A:
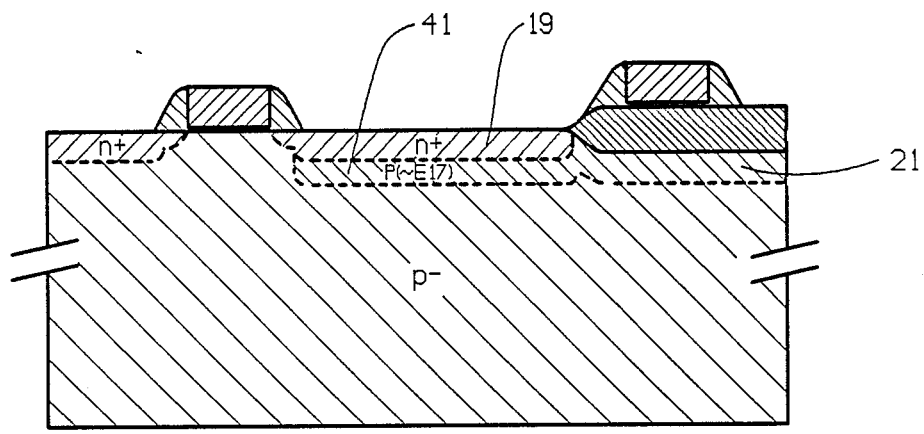
FIG. 4A is the cross-sectional view of the cell of FIG. 3A, following a boron ion "Hi-C" implant.
Figure 4B:
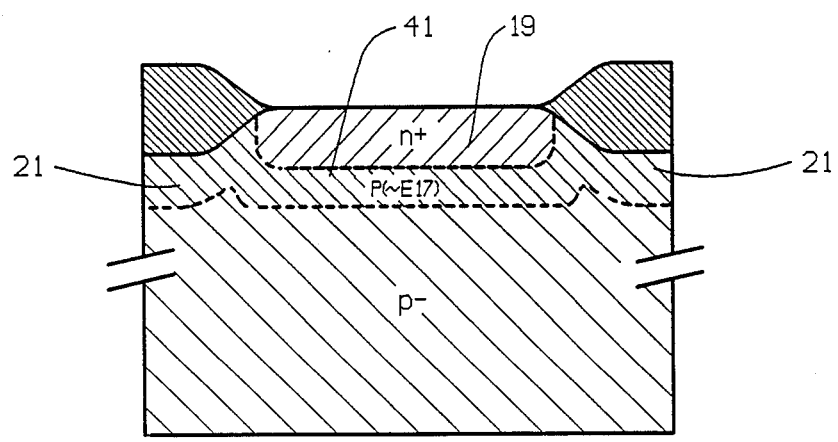
FIG. 4B is the cross-sectional view of the cell of FIG. 3B, following a boron ion "Hi-C" implant.

Referring now to FIGS. 4A and 4B, the entire cell of FIGS. 3A and 3B has been subjected to a boron "Hi-C" implant, which creates an active region substrate 41 of p-type silicon beneath active region 19 and increases the positive nature of the channel-stop p-type silicon 21. The boron concentration beneath the active regions and in the channel-stop regions is on the order of $10^{17}$ atoms per cubic centimeter (E17).

Figure 5A:
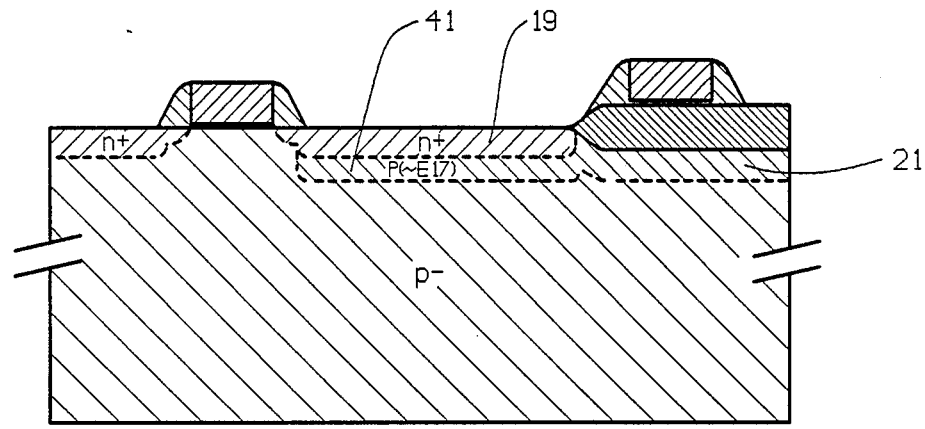
FIG. 5A is the cross-sectional view of the cell of FIG. 4A, following a LER oxide etch, with the arrows indicating the cell region to receive a phosphorus implant.
Figure 5B:
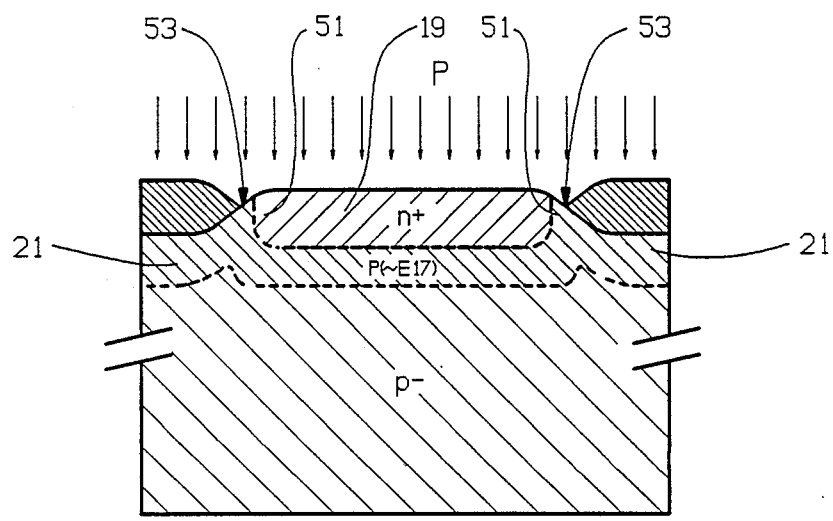
FIG. 5B is the cross-sectional view of the cell of FIG. 4B, following a LER oxide etch, with the arrows indicating the cell region to receive a phosphorus implant.

Referring now to FIGS. 5A and 5B, the cell of FIGS. 4A and 4B has been subjected to a LER oxide etch in order to enlarge the active region 19. Although cell capacitor plate area has been increased by the LER process, the breakdown voltage of the p-n junctions 51 in the cell's bird's beak regions 53 has been lowered. When the cell's capacitor is completed by depositing a nitride dielectric layer followed by a poly-2 layer over the active region 19, the alignment of the poly-2 layer is critical. If it overlies p-n junctions 51, the junctions will become highly susceptible to leakage attributable to both gated-diode breakdown and band-band tunneling phenomena. The arrows indicate the cell region to be subjected to a phosphorus implant.

Figure 6A:
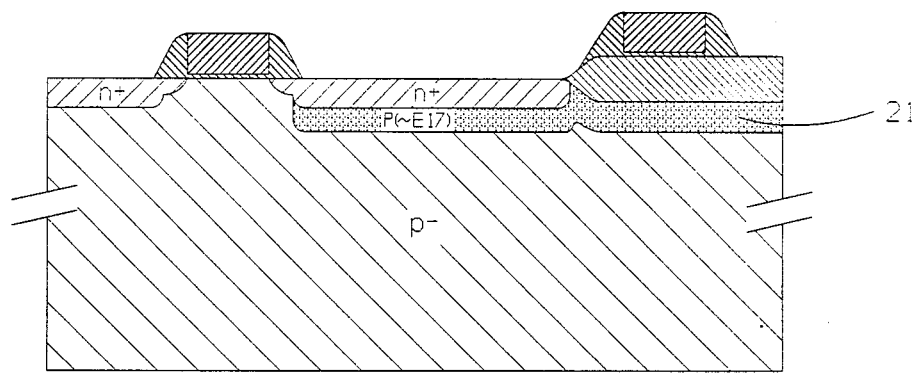
FIG. 6A is the cross-sectional view of the cell of FIG. 5A, following a phosphorus implant.
Figure 6B:
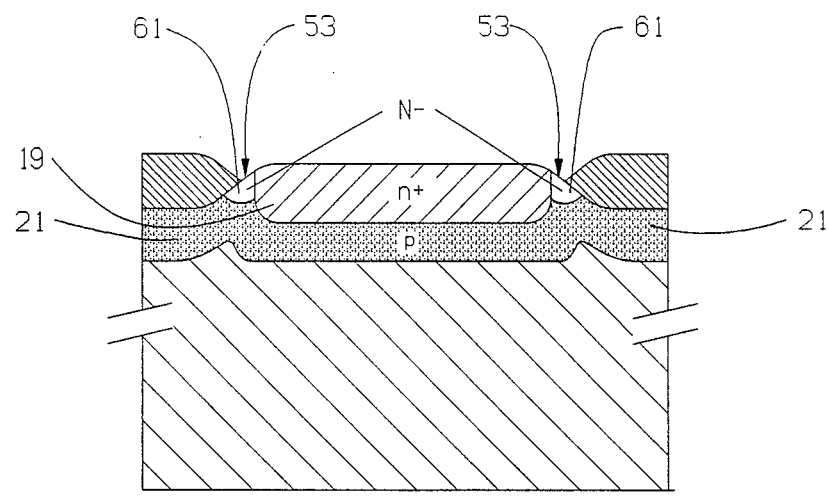
FIG. 6B is the cross-sectional view of the cell of FIG. 5B, following a phosphorus implant.

Referring now to FIGS. 6A and 6B, the cell of FIGS. 5A and 5B has been implanted with phosphorus ions using an electric field strength of 50 to 100 kev at a dosage of 1E12 to 1E13 per square centimeter. This phosphorus implanting has created n- regions 61 in the bird's beak regions 53 between the channel-stop p-type silicon 21 and the n+ silicon of active region 19. The n- regions 61 have essentially created a gradient between the p-type silicon of channel-stop regions 21 and the n+ silicon of the active region 19 and FET source region 15. The gradient dramatically decreases capacitor leakage by raising junction breakdown voltage in the bird's beak regions 53.

Figure 7A:
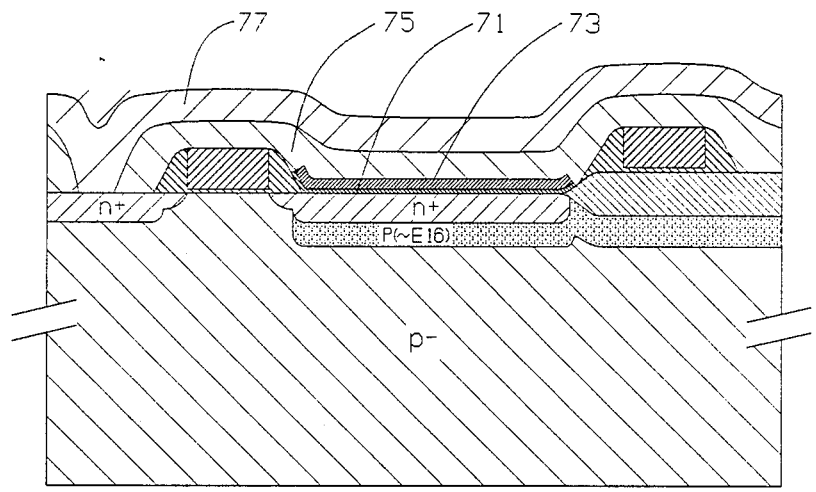
FIG. 7A is the cross-sectional view of the cell of FIG. 6A, following the deposition of a silicon nitride layer and a poly-2 layer.
Figure 7B:
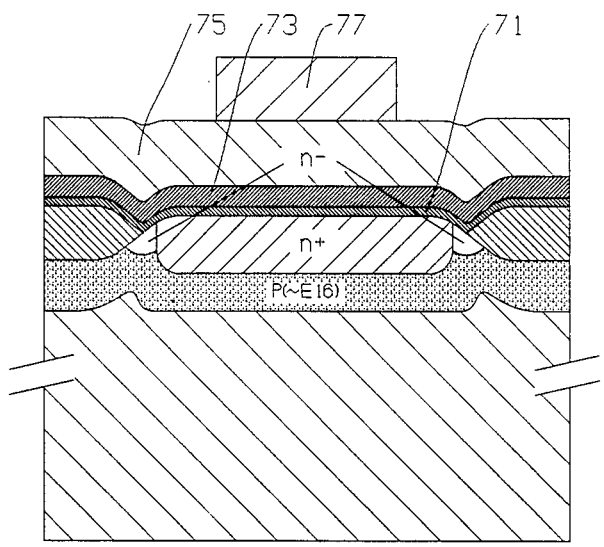
FIG. 7B is the cross-sectional view of the cell of FIG. 6B, following the deposition of a silicon nitride layer, a poly-2 layer, a BPSG layer, and a metallic bit line.

Referring now to FIGS. 7A and 7B, the cell has been completed with the deposition of a nitride layer 71, followed by the deposition of a poly-2 cell plate 73, followed by the deposition of a boro-phospho-silicate glass (BPSG) isolation layer 75, followed by the deposition of a metallic bit line 77.

We claim:

1. A process for reducing the electric field effect in the bird's beak region of a DRAM cell following expansion of the cell's active area, which had previously been implanted with arsenic to create N+ regions, through local encroachment reduction, said process comprising the step of blanket implanting the active are with phosphorus to create N— regions between the N+ regions and the edge of the field oxide.

2. The process of claim 1 wherein said implanting with phosphorus is performed with a phosphorus concentration of 1E12 to 1E13 per centimeter squared.

3. The process of claim 2 wherein said implanting with phosphorus is performed within an energy range of 50 to 100 kev.

4. A process for creating a graded N-P junction within a DRAM cell, the capacitive region of which has been expanded through local encroachment reduction, said process comprising the following steps which begin subsequent to the conventional creation of field oxide regions having an underlying channel-stop implant of p-type material, creation of a gate oxide layer, creation of a transistor gate for the cell by etching a polysilicon layer, the self-aligned implant of lightly-doped (N—) source and drain regions, and creation of transistor gate sidewall spacers by anisotropically etching a spacer oxide layer, and prior to the deposition of the cell dielectric layer, said process comprising the following steps:
    (a) blanket implanting of arsenic in the cell active area to create an N+ region;
    (b) etching back field oxide regions that surround the cell active area in order to reduce the size of the bird's beak regions and expand the active area; and
    (c) blanket implanting of phosphorus in the cell active area to create N— regions between the N+ region and the edge of the field oxide regions.

5. The process of claim 4 which further comprises the step of implanting boron atoms beneath the N+ region.

6. The process of claim 5 wherein said implanting with phosphorus is performed with a phosphorus concentration of 1E12 to 1E13 per centimeter squared.

7. The process of claim 6 wherein said implanting with phosphorus is performed within an energy range of 50 to 100 kev.

* * * * *

UNITED STATES PATENT AND TRADEMARK OFFICE
CERTIFICATE OF CORRECTION

PATENT NO. : 4,959,325
DATED : September 25, 1990
INVENTOR(S) : Ruojia R. Lee et al.

It is certified that error appears in the above-indentified patent and that said Letters Patent is hereby corrected as shown below:

Column 3, line 16, delete "(PET)" and insert -- (FET) --;

Column 4, line 32, delete "are" and insert -- area --;

Signed and Sealed this

Twenty-eighth Day of December, 1993

Attest:

BRUCE LEHMAN

Attesting Officer     Commissioner of Patents and Trademarks